United States Patent
Peterson et al.

(10) Patent No.: US 9,692,445 B1
(45) Date of Patent: Jun. 27, 2017

(54) SIGMA-DELTA MODULATOR FOR GENERATING A SINUSOIDAL SIGNAL

(71) Applicant: TEXAS INSTRUMENTS INCORPORATED, Dallas, TX (US)

(72) Inventors: Brent Peterson, Dallas, TX (US); Joonsung Park, Allen, TX (US); Krishnaswamy Nagaraj, Plano, TX (US); Tyler Witt, Maineville, OH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/072,837

(22) Filed: Mar. 17, 2016

(51) Int. Cl.
   *H03M 1/10* (2006.01)
   *H03M 3/00* (2006.01)

(52) U.S. Cl.
   CPC .............. *H03M 3/38* (2013.01); *H03M 3/30* (2013.01); *H03M 3/496* (2013.01)

(58) Field of Classification Search
   CPC ........... H03M 3/38; H03M 3/30; H03M 3/496
   USPC .................................................. 341/143, 120
   See application file for complete search history.

(56) References Cited

U.S. PATENT DOCUMENTS

| | | | |
|---|---|---|---|
| 6,795,007 B2* | 9/2004 | Mayes | H03M 3/498 341/143 |
| 6,911,927 B2* | 6/2005 | Wang | H03M 3/50 341/143 |
| 9,164,526 B2* | 10/2015 | Pan | G11C 5/145 |

* cited by examiner

*Primary Examiner* — Brian Young
(74) *Attorney, Agent, or Firm* — John R. Pessetto; Charles A. Brill; Frank D. Cimino

(57) ABSTRACT

A system includes a storage device containing machine instructions and a plurality of digital values of an over-sampled sinuisoidal signal. The system also includes a core coupled to the storage. The core is configured to execute the machine instructions, wherein, when executed, the machine instructions cause the core to implement a sigma-delta modulator that retrieves the plurality of digital values from the storage device as input to the modulator. The sigma-delta modulator is configured compute an output bit stream. The system further includes an analog filter configured to receive the output bit stream from the core and to low-pass filter the output bit stream to produce a sinusoidal output signal.

17 Claims, 2 Drawing Sheets

SIGMA-DELTA MODULATOR FOR GENERATING A SINUSOIDAL SIGNAL

BACKGROUND

Some applications require the use of a sinusoidal input signal at a predetermined level of precision. For example, some calibration processes may necessitate the use of a sinusoidal input as a reference signal for calibration purposes. Some microcontrollers may be able to generate, or assist in the generation of, the desired sinusoidal signal.

In one example, a microcontroller generates a 50% duty cycle pulse train at the desired frequency. The pulse train is then low-pass filtered in an attempt to filter out all harmonics except for the desired fundamental frequency. For the generation of relatively low frequency sinusoids, however, the frequency spacing between the harmonic signal content is close enough so as to necessitate a relatively high order low pass filter. For example, if a 7.8125 Hz sinewave is desired, the spacing between the fundamental frequency at 7.8125 and the third harmonic, fifth harmonic, and so on is only 15.625 Hz (double the 7.8125 Hz fundamental frequency). Further, the amplitude of the various harmonics are fairly large and may not be much smaller than the amplitude of the fundamental frequency. As a result of the tight spacing in the frequency domain between the desired fundamental frequency and the undesirable closest harmonics (i.e., third and fifth harmonics), a higher order filter such as an eighth order, elliptic filter may be needed to sufficiently recover the fundamental frequency and generate the desired sine wave.

The use of such high order filters is expensive in terms of area on the circuit board or substrate and adds to the power consumption of the device.

BRIEF DESCRIPTION OF THE DRAWINGS

For a detailed description of various examples, reference will now be made to the accompanying drawings in which.

DETAILED DESCRIPTION

Figure 1:
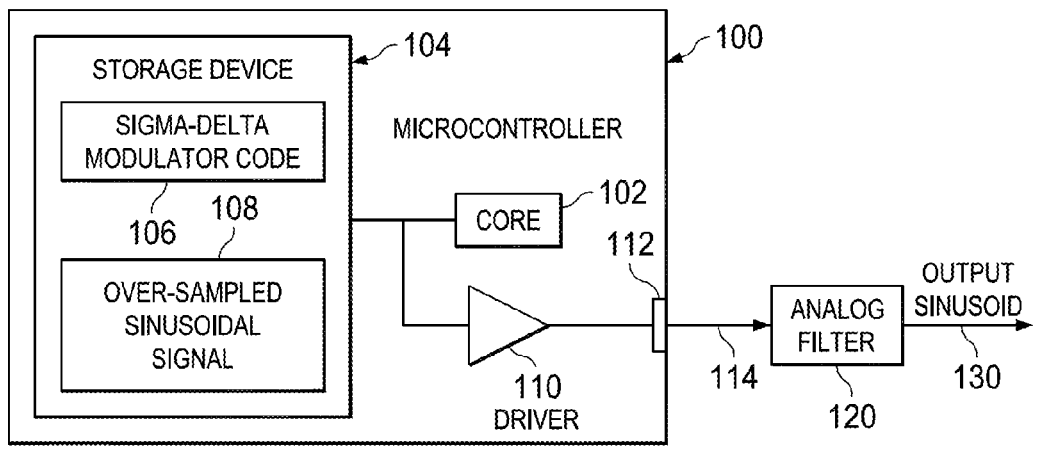
FIG. 1 shows an embodiment of a microcontroller configured to implement a sigma-delta modulator to assist in producing a sine wave in accordance with various examples.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

In at least some embodiments, a microcontroller executes a software-based sigma-delta modulator to process digital values of an oversampled sinusoidal signal. The term oversampling is used to indicate a sampling that is performed higher than the minimum required by the Nyquist Theorem. The sinusoidal signal is of a frequency to be subsequently generated with the assistance of the microcontroller. The amount of oversampling can vary from application to application. For example, the sinusoidal signal may be oversampled by a factor of 65,536. That is, each cycle of the sinusoidal signal is sampled 65,536 times—and may be much higher than the minimum required by the Nyquist Theorem.

To generate the desired output sinusoidal signal, the core of the microcontroller executes the sigma-delta modulator code. In some embodiments, the code causes the core to implement a second order sigma-delta modulator. The input to the sigma-delta modulator is the digital values representing the oversampled sinusoidal signal. Each input digital value to the modulator may be a multibit value (e.g., a 16-bit value) representing the voltage at a particular instance in time of the sinusoidal signal. The output of the sigma-delta modulator is a bit stream of 1's and 0's. Each bit is generated by the modulator upon receipt and processing of each multi-bit input value. As such, the number of bits of the output bit stream for each cycle of the desired output sinusoid is equal to the number of samples acquired of the original analog input signal. The bit stream is repeated by the microcontroller.

The output bit stream from the microcontroller has the characteristic in the frequency domain of a large amplitude peak at the desired fundamental frequency. The magnitude of the higher order harmonics is reduced compared to a square wave since the input to the sigma-delta modulator is a sine-wave with the desired fundamental frequency. Also thermal noise and quantization noise around the desired fundamental frequency are pushed toward higher frequency. As a result of reducing the magnitude of the harmonics and noise, particularly the third and fifth harmonics, a lower order low-pass filter can be used to filter the bit stream output of the microcontroller. In some cases, the low-pass filter may be a fourth order passive filter, although the filter can be implemented in different forms in other embodiments.

FIG. 1 shows a system diagram including a microcontroller 100 coupled to an analog filter 120. The microcontroller 100 includes a core 102 coupled to a storage device 104 and an output driver 110. Other components may be included as well in the microcontroller 100. The storage device 104 may be separate from the core 102, or may be included within the core. The storage device 104 includes non-transitory storage such as volatile memory (e.g., random access memory) and/or non-volatile storage (e.g., electrically erasable read only memory). The storage device 104 includes sigma-delta modulator code 106. This code comprises machine instructions which can be retrieved by the core 102 for execution thereon. Some or all of the functionality described herein may be implemented by the core 102 through execution of the sigma-delta modulator code 106. References to operations performed by the sigma-delta modulator code 106 refer to the core 102 performing such operations through execution of the code.

Upon execution by the sigma-delta-modulator code 106, the core 102 generates an output bit stream that is provided through driver 110 and an output terminal (e.g., pin) 112 to analog filter 120. The analog filter 120 implements a low-pass filter that attenuates higher order harmonics (e.g., third and higher harmonics) thereby passing through the fundamental frequency which creates the output sinusoid 130 (also referred to as a sinusoidal signal). The output sinusoid 130 can have any desired frequency. In some cases, the desired frequency of the output sinusoid 130 is less than or equal to 2 KHz and in some examples less than or equal to 250 Hz such as 7.8125 Hz, 15.625 Hz, 31.25 Hz, 62.5 Hz, 125 Hz, or 250 Hz. Additional or different frequencies are possible as well.

The microcontroller 100 is programmed to be able to generate an output bit stream 114 which, when filtered by the analog filter 120 produces the output sinusoid 130 at the desired frequency (e.g., 7.8125 Hz, 15.625 Hz, etc.). The programming process includes oversampling a sinusoidal signal of the desired frequency and storing at least some of the samples in the storage device 104 as oversampled sinusoidal signal data 108. The oversampled sinusoidal signal data 108 thus includes digital values representing sampled voltages of an oversampled sinusoidal signal. The frequency of the oversampled sinusoidal signal is the desired frequency of the eventual output sinusoid 130 produced by the microcontroller 100 in concert with the analog filter 120. The sampling frequency is greater than the Nyquist Theorem minimum requirement. For example, for a desired 7.8125 Hz output sinusoid 130, a 7.8125 Hz signal may be oversampled at a rate of 65,536 samples per period of the 7.8125 Hz sinusoid (i.e., 512K samples per second). In this example, 65,536 samples of one period of the 7.8125 Hz sinusoid may be stored as oversampled sinusoidal signal data 108 in the storage device 104. Such data may be stored in the microcontroller 100 during production or at a later date and time, but before the microcontroller is to be used in the generation of the output sinusoid 130.

During runtime of the microcontroller 100, the core executes the sigma-delta modulator code 106 to implement a sigma-delta modulator. In some embodiments, the sigma-delta modulator implemented in code 106 is a second-order sigma-delta modulator, but can be other than a second-order modulator in other embodiments. The sigma-delta modulator code 106 causes the core 102 to retrieve the digital values of the oversampled sinusoidal signal data 108 from the storage device 104 as input to the modulation function performed by the code. The sigma-delta modulator code 106 computes an output bit stream using the digital values of the oversampled sinusoidal signal data 108 as input.

The output bit stream is a particular series of 1's and 0's that, when low-pass filtered by the analog filter 120 results in a sine wave of the desired frequency (e.g., 7.8125 Hz). In the frequency domain, the bit stream computed by the sigma-delta modulator code 106 has a fundamental frequency at the frequency of interest. The magnitude of the harmonics, however, is greatly suppressed relative to a square wave with the same fundamental frequency. The modulator noise-shapes a single tone sine wave to push power out to higher frequencies thereby relaxing the requirement of having a higher order filter. As a result, the filter 120 can be a simple lower order filter than would have been possible with a standard square wave, such as a passive fourth-order filter.

The driver 110 receives the output bit stream from the core 102 upon executing the sigma-delta modulator code 108 and provides appropriate signal conditioning (e.g., impedance matching, amplification, etc.) to transmit the output bit stream to the analog filter 120.

In some embodiments, the sigma-delta modulator code repeatedly generates the output bit stream by sequencing the oversampled sinusoidal signal data 108 through the modulator over and over again. For example, the oversampled sinusoidal signal data 108 may include digital values representing samples of one complete cycle of the desired frequency sine wave. That sequence of digital values is run through the modulator over and over thereby representing a continuous sine wave input (albeit in digital form).

Because the sinusoidal signal has been oversampled, storing one complete cycle's worth of samples may impose a significant capacity burden on storage device 104. In some examples, each sample of the oversampled sinusoidal signal may comprise a 16-bit value. If a 7.8125 Hz sine wave is sampled at a rate of 512K samples per second, then samples representing one complete cycle of the sine wave amounts to 512K×16 bits=8192K bits to be stored in storage device 104.

Figure 2:
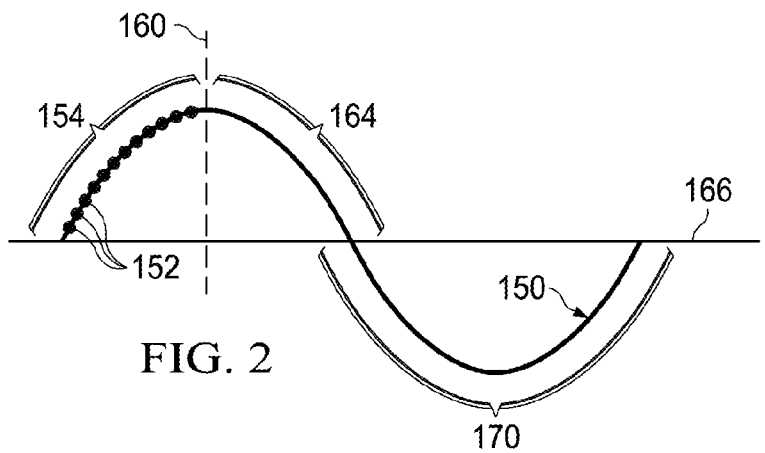
FIG. 2 illustrates a technique for saving memory in accordance with various examples.

In accordance with some embodiments, the digital values representing the oversampled sinusoidal signal stored in storage device 108 only comprise digital values corresponding to less than one full cycle of the sinusoidal signal. For example, the digital values may represent only one-quarter of a cycle of the sinusoidal signal. If one-quarter cycle's worth of samples are stored as oversampled sinusoidal signal 108, then the full cycle's worth of such samples can be calculated by the sigma-delta modulator code. For example, FIG. 2 illustrates one cycle of an analog sinewave 150. The first quarter 154 of the sinewave 150 has been oversampled as indicated by samples 152. The samples of the rest of the cycle can be computed by the core 102. For example, the samples 152 of the first quarter cycle 154 can be mathematically mirrored about axis 160 to compute samples in the second quarter cycle 164. Then, the samples of the upper half of the cycle (combination of quarter cycles 154 and 164) can be mathematically mirrored about axis 166 (i.e., inverted) and shifted to the right to coincide with the lower half cycle 170.

Another optimization that can help save memory is to save m out of every n samples of the analog sinusoid and interpolate the samples to compute the samples that were not saved. For example, for a sampling rate of 512 KHz, a desired sinusoid frequency of 7.8125 Hz, and saving 1 out of every 16 samples, 4 kB of storage would be needed compared to 64 kB of storage being required without interpolation. In some embodiments, the sigma-delta modulator code 106 performs a linear interpolation process of the samples. In one variation of linear interpolation, the step size of each interpolation point may be saved in storage device 104, and the step size is used to compute the interpolated samples. In another variation, the step size can be calculated by the sigma-delta modulator code 106, such as by computing the difference of stored interpolation points and dividing by the interpolation rate (16 in the previous example). An interpolation rate that is a power of two is helpful so that an arithmetic shift right can be used instead of an integer divide, but a power other than two is possible as well.

Some embodiments include saving only a subset of the samples of one entire cycle (e.g., one quarter cycle's worth of samples) of the analog sinusoidal signal but not implementing interpolation. Other embodiments include the implementation of interpolation, but saving an entire cycle of the analog sinusoidal signal (not just a subset of one cycle). Yet other embodiments include implementing both interpolation and saving less than an entire cycle's worth of the analog sinusoidal signal.

Figure 3:
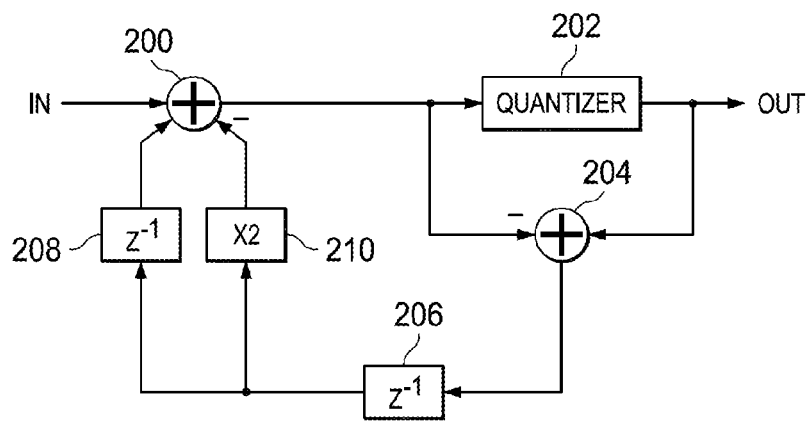
FIG. 3 illustrates an implementation of a second-order sigma-delta modulator in accordance with various examples.

FIG. 3 illustrates an example of a second order sigma-delta modulator as may be implemented by the sigma-delta modulator code 106 in accordance with various embodiments. The modulator in the example of FIG. 3 includes two summers 200 and 204, a quantizer 202 (e.g., a comparator), two integrators 206, and 208, and an amplifier 210 (e.g., gain of 2). The input signal is recursively integrated by the two integrators and then quantized to a 1-bit value by quantizer 202 in order to generate a 1-bit stream which represents an average value of the input signal while thermal noise and quantization noise are pushed toward higher frequency In some embodiments, during runtime of the microcontroller, the core 102 may be tasked with causing a sinusoidal signal to be generated. For example, the core 102 may execute code that initiates the generation of a sinusoidal signal. When that occurs, the sigma-delta modulator code 106 may be executed by the core to retrieve the digital data from the storage device 104 representing the oversampled sinusoidal signal, and provide those data to the software implementation of the sigma-delta modulator. The data is repeatedly provided to the modulator in a continuous stream of input to the modulator for as long as the output sinusoidal signal is to be generated. The code 106 continuously executes to compute the output bit stream 114 which is provided to the analog filter.

In other embodiments, the output bit stream can be precomputed during, for example, an initialization process of the microcontroller and stored in the storage device for subsequent use during runtime. During the initialization process, the core may retrieve the oversampled sinusoidal signal data from the storage device and provide the samples to a software implementation of the sigma-delta modulator. Rather than providing the output bits computed by the modulator through the driver to the analog filter, the core stores the modulator's output bits back into the storage device. Then, during runtime of the microcontroller at a time when the core is tasked with causing a sinewave of a desired frequency to be generated, the core retrieves the output bits, previously computed by the software-implemented modulator, and transmits those bits to the analog filter. The sequence of bits is repeatedly transmitted to the filter for generation of the desired output sinusoid. This embodiment permits the sinewave to be generated, while not burdening the core in modulator-intensive calculations. The modulator is executed once by the core during a prior initialization process.

Figure 4:
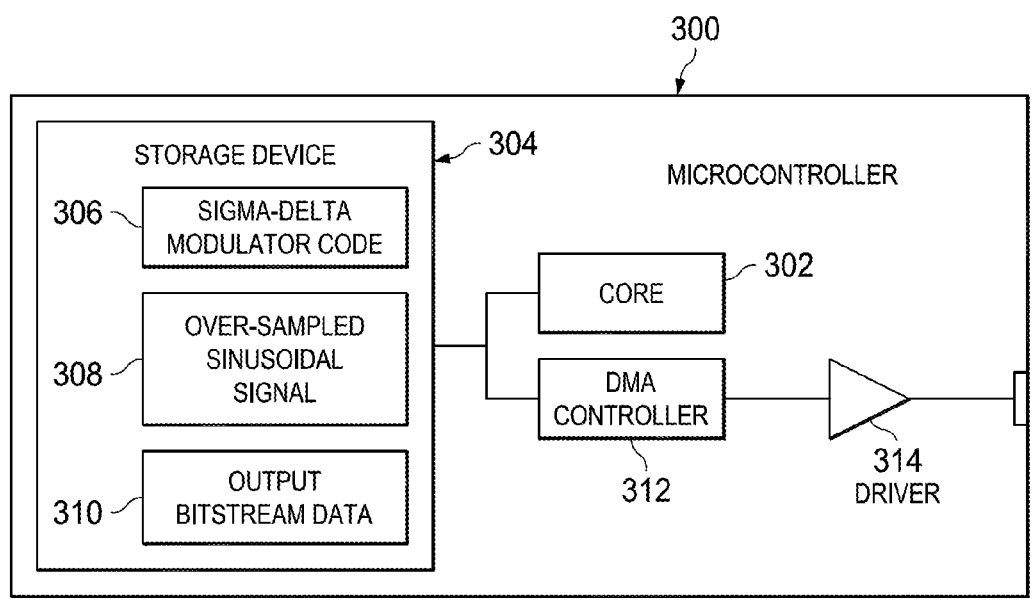
FIG. 4 shows another example of a microcontroller in accordance with various embodiments.

FIG. 4 shows an example of a microcontroller in accordance with the embodiment described above. As shown, the microcontroller 300 includes some of the same components as in FIG. 1. For example, the microcontroller 300 includes a core 302 coupled to a storage device 304 as in FIG. 1. A driver 314 also is included. The microcontroller 300 of FIG. 3 further includes a direct memory access (DMA) controller 312. The storage device 304 also stores output bit stream data.

In this embodiment, the core performs an initialization process (e.g., a power-on reset). During that process, the core executes the sigma-delta modulator code 306 using as input the oversampled sinusoidal signal data 308 as described above. The resulting sequence of bits which, when filtered by the filter (FIG. 1), results in one cycle of the desired output sinusoid, is stored back in storage device 304 as output bit stream data 310.

During a subsequent runtime of the microcontroller, the core 302 may be tasked with causing an output sinusoid to be generated. Rather than implementing a sigma-delta modulator, the core causes the previously stored output bit stream data 310 to be provided through the driver 314 to the analog filter. In this embodiment, the core 302 programs the DMA controller 312 with the location of the output bit stream data 310 in the storage device and initiates the DMA controller 312 to retrieve the data from storage 304 and transmit the data through the driver 314 to the filter, thereby freeing the core 302 to perform other tasks. The DMA controller 312 may repeatedly transmit the output bit stream data 310 to the filter.

In further embodiments, the output bits from the software-implemented sigma-delta modulator to be stored in the storage device 310 are packed into bytes for storage in the storage device. For example, each byte of the output bit stream data 310 may contain eight consecutive bits of the modulator's output. Byte-packing the modulator's output bits makes further efficient use of the capacity of the storage device 304.

Figure 5:
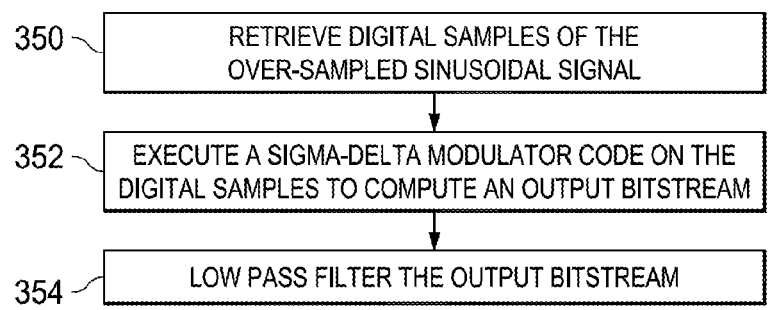
FIG. 5 shows a flow chart of a method in accordance with various examples.

FIG. 5 shows a flow chart illustrating a method in accordance with an embodiment. At 350, the method includes retrieving from a storage device, digital samples of an over-sampled analog sinusoidal signal. The samples may have been stored in storage of a microcontroller and then retrieved by the microcontroller's core. The method then includes executing, by a core, a sigma-delta modulator code on the retrieved digital samples to compute an output bit stream (352), and then filtering (354) the output bit stream by a low pass filter such as an analog filter to produce the desired sinewave.

Retrieving the digital samples at 350 and executing the sigma-delta modulator code on the retrieved digital samples to compute an output bit stream at 352 may be performed during an initialization process of the microcontroller. In such embodiments, the method may further comprise storing the output bit stream from the modulator to the storage device. After the initialization process, the method may include retrieving the output bit stream from the storage device and transmitting the output bit stream to the low pass filter for generation of the desired sinewave.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
   a storage device containing machine instructions and a plurality of digital values of an oversampled sinusoidal signal;
   a core coupled to the storage and configured to execute the machine instructions, wherein, when executed, the machine instructions cause the core to implement a sigma-delta modulator that retrieves the plurality of digital values from the storage device as input to the modulator, wherein the sigma-delta modulator implemented by the core is configured compute an output bit stream and;
   an analog filter coupled to the core and configured to receive the output bit stream from the core and to low-pass filter the output bit stream to produce a sinusoidal output signal.

2. The system of claim 1, wherein the machine instructions cause the core to implement a second-order sigma-delta modulator.

3. The system of claim 1, wherein the sinusoidal output signal has a frequency less or equal to 250 Hz, and the analog filter is a passive fourth order analog filter.

4. The system of claim 1, wherein the plurality of digital values of the oversampled sinusoidal signal only comprise digital values corresponding to less than one full cycle of the sinusoidal signal.

5. The system of claim 1, wherein the plurality of digital values of the oversampled sinusoidal signal only comprise digital values corresponding to one-quarter of a cycle of the sinusoidal signal.

6. The system of claim 1, wherein the machine instructions, when executed, cause the core to interpolate the digital values of the oversampled sinusoidal signal digital values for input to the modulator.

7. The system of claim 1, wherein, when executed, the machine instructions cause the core to:
 implement the sigma-delta modulator to compute and save the output bit stream to the storage device; and
 retrieve the output bit stream previously saved to the storage device and transmit the retrieved output bit stream to the analog filter.

8. The system of claim 7, wherein, when executed, the machine instructions cause the core to repeatedly transmit the retrieved output bit stream to the analog filter.

9. The system of claim 7, wherein, when executed, the machine instructions cause the core to pack the bits of the output bit stream into bytes for storage into the storage device.

10. The system of claim 7, wherein, when executed, the machine instructions cause the core, during a system initialization, to determine a frequency for the sinusoidal output signal and implement the sigma-delta modulator.

11. A microcontroller, comprising:
 a storage device containing machine instructions and a plurality of digital values of an oversampled sinusoidal signal;
 a core coupled to the storage and configured to execute the machine instructions, wherein, when executed, the machine instructions cause the core to:
  during an initialization of the microcontroller, retrieve the plurality of digital values from the storage device and implement a sigma-delta modulator to process retrieved plurality of digital values to generate an output bit stream that includes less than one cycle of the oversampled sinusoidal signal and save the output bit stream to the storage device; and
  during run-time of the microcontroller, retrieve the output bit stream from the storage device and repeatedly transmit the output bit stream through an output terminal of the microcontroller.

12. The microcontroller of claim 11, wherein, when executed, the machine instructions cause the core to pack the bits of the output bit stream into bytes with each byte containing eight of the output bit stream bits and to save the packed bytes to the storage device.

13. The microcontroller of claim 11, wherein the plurality of digital values of the oversampled sinusoidal signal only comprise digital values corresponding to one-quarter of a cycle of the sinusoidal signal.

14. The microcontroller of claim 11, wherein the machine instructions, when executed, cause the core to interpolate the plurality of digital values of the oversampled sinusoidal signal for input to the core-implemented modulator.

15. The microcontroller of claim 11, wherein when executed, the machine instructions cause the core, during the initialization, to determine a frequency for the sinusoidal output signal and implement the sigma-delta modulator.

16. The microcontroller of claim 11, wherein the storage device contains multiple sets of digital values of oversampled sinusoidal signals, each set corresponding to an oversampled sinusoidal signal of a different frequency.

17. A method, comprising:
 retrieving from a storage device, digital samples of an over-sampled analog sinusoidal signal;
 executing a sigma-delta modulator code on the retrieved digital samples to compute an output bit stream; and
 filtering the output bit stream by a low pass filter;
 wherein retrieving the digital samples and executing the sigma-delta modulator code on the retrieved digital samples to compute an output bit stream occurs during an initialization process, and wherein the method further comprises:
 storing the output bit stream to a storage device;
 after the initialization process, retrieving the output bit stream from the storage device and transmitting the output bit stream to the low pass filter.

* * * * *